US007468234B2

(12) United States Patent
Kawauchi

(10) Patent No.: US 7,468,234 B2
(45) Date of Patent: Dec. 23, 2008

(54) PLANOGRAPHIC PRINTING PLATE PRECURSOR

(75) Inventor: Ikuo Kawauchi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 313 days.

(21) Appl. No.: 11/207,782

(22) Filed: Aug. 22, 2005

(65) Prior Publication Data

US 2006/0040209 A1 Feb. 23, 2006

(30) Foreign Application Priority Data

Aug. 20, 2004 (JP) ............................. 2004-241578

(51) Int. Cl.
*G03F 7/004* (2006.01)

(52) U.S. Cl. .................................... 430/270.1; 430/302

(58) Field of Classification Search ................. 430/302, 430/270.1

See application file for complete search history.

(56) References Cited

U.S. PATENT DOCUMENTS

| | | | | |
|---|---|---|---|---|
| 6,475,698 | B2 * | 11/2002 | Monk et al. | 430/270.1 |
| 6,921,620 | B2 * | 7/2005 | Hayakawa et al. | 430/157 |

FOREIGN PATENT DOCUMENTS

| | | | |
|---|---|---|---|
| EP | 0 897 134 | A2 | 2/1999 |
| JP | 2001-133965 | A | 5/2001 |
| JP | 2002-517786 | A | 6/2002 |
| WO | WO 99/63407 | A1 | 12/1999 |

* cited by examiner

*Primary Examiner*—John S Chu
(74) *Attorney, Agent, or Firm*—Sughrue Mion, PLLC

(57) ABSTRACT

The planographic printing plate precursor according to the present invention includes: a support; and a photosensitive layer provided on the support and containing a polymer having the structural unit represented by the following Formula (1) and an acid coloring colorant represented by the following Formula (2). The planographic printing plate precursor is superior in each of chemical resistance, solubilization discrimination, and image reproducibility.

Formula (1)

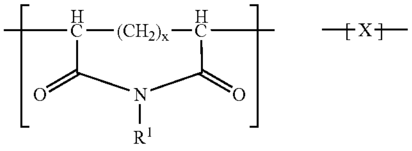

(A) (B)

Formula (2)

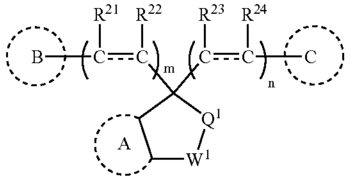

In Formula (1) above, X represents a bivalent connected group; $R^1$ represents an alkyl or aryl group; and x is 0 or 1.

In Formula (2) above, rings A, B and C each independently represent a mono- to tri-nuclear aromatic hydrocarbon group or a heterocyclic aromatic group; at least one of the rings B and C is substituted with at least one substituent group selected from the group consisting of amino, alkoxy, aryloxy, alkylthio, and arylthio groups; the rings B and C may bind to each other via a binding group; $W^1$ represents a carbonyl group, a thiocarbonyl group, or, —C($R^{25}$)═N—, wherein $R^{25}$ represents a hydrogen atom or a hydrocarbon group, and $Q^1$ represents an oxygen or sulfur atom, or an imino group; $R^{21}$ to $R^{24}$ each independently represents a hydrogen atom or a hydrocarbon group; and m and n are each independently 0 or 1.

13 Claims, No Drawings

PLANOGRAPHIC PRINTING PLATE PRECURSOR

CROSS-REFERENCE TO RELATED APPLICATION

This application claims priority under 35 USC 119 from Japanese Patent Application No. 2004-241578, the disclosure of which is incorporated by reference herein.

BACKGROUND OF THE INVENTION

1. Field of the Invention

The present invention relates to a so-called direct-plate-making IR laser-sensitive planographic printing plate precursor that allows direct plate-making on the basis of digital signals for example from computer, and in particular to a planographic printing plate precursor superior in chemical resistance, greater in solubility change in the exposed area, and superior in image reproducibility.

2. Description of the Related Art

Planographic printing plates that allow plate making with infrared laser are attracting attention recently as planographic printing plates. In the recent rapid progress in laser, higher-output and smaller solid state and semiconductor lasers having an emission wavelength in the range from near-infrared to infrared are becoming more easily accessible. These lasers play an important role as an exposure-light source, when planographic printing plates are produced directly form digital data, for example, from computer.

Materials which can be used for a positive type planographic printing plate precursors applicable for infrared lasers include, as essential components, a binder resin soluble in an aqueous alkaline solution and an infra red dye which absorbs light to generate heat. The infra red dye interacts with the binder resin in an unexposed portions (image portions) so as to function as a dissolution inhibitor which can substantially reduce the solubility of the binder resin. On the other hand, in an exposed portions (non-image portions), interaction of the infra red dye with the binder resin is weakened by the heat generated. Consequently, an exposed portion can turn into a state in which it can be dissolved in an alkaline developer, so that an image is formed thereon.

However, insofar as infrared-laser-applicable positive planographic printing plate precursor materials are concerned, differences in the degree of resistance against dissolution in a developer between unexposed portions (image portions) and exposed portions (non-image portions) therein, that is, differences in development latitude have not yet been sufficient under various conditions of use. Thus, problems have occurred insofar that, with changes in developing conditions, the unexposed portions (i.e., the image portions) may be dissolved during development or stains at the non-image portion due to insufficient development may be generated.

Such problems stem from fundamental differences in plate-making mechanisms between infrared-laser-applicable positive type planographic printing plate precursor materials and positive type planographic printing plate precursor materials from which printing plates are made up by exposure to ultra violet rays.

In other words, positive type planographic printing plate precursor materials from which printing plates are made up by exposure to ultra violer rays each include, as essential components, a binder resin soluble in an aqueous alkaline solution and an onium salt, or a quinonediazide compound. This onium salt or quinonediazide compound not only interacts with the binder resin in unexposed portions (image portions) to function as a dissolution inhibitor, but in exposed portions (non-image portions) it is also decomposed by light and generates an acid to function as a dissolution promoter. In this way, the onium salt, or the quinonediazide compound, performs dual functions.

On the other hand, in infrared-laser-applicable positive type planographic printing plate precursor materials, the infra red dye functions only as a dissolution inhibitor of unexposed portions (image portions), and does not promote the dissolution of exposed portions (non-image portions).

In addition, the image-forming efficiency of such infrared-laser positive-type planographic printing plate precursors depends on the heat generated as a result of exposure of the recording layer surface to infrared laser. The amount of heat for use in image forming, i.e., the amount of heat used for solubilization of the recording layer, is smaller in the region closer to the support due to diffusion of the heat to the support, making the planographic printing plate precursor less sensitive. Accordingly, reduction of the development-suppressing effect at a non-image region of the recording layer is not sufficient, leading to decrease in difference between image and non-image regions and consequently a problem of insufficient image reproducibility.

A recording layer formed by using a material that can be easily developed in the non-image region may be effective in solving the aforementioned problem in image reproducibility, but the image region of such a recording layer exhibits poor chemical resistance, i.e., is chemically weak and vulnerable to the developer and the ink cleaning solvent, plate cleaner, and the like used during printing. Thus, there existed an urgent need for a recording layer that is superior in the chemical resistance and durability of the film and superior in developability after release or cancellation of the dissolution-suppressing effect.

A method of forming a recording layer by using a polymer having a maleimide group that is superior in developability and chemical resistance as the binder has been proposed to solve the problems above, (e.g., Japanese Patent Application National Publication (Laid-Open) No. 2002-517786). However, although the recording layer of JP A 2002-517786 was improved in chemical resistance to some extent, the dissolution-suppressing effect in the unexposed region is not sufficient, causing problems such as: generation of white blank in an image region due to undesirable dissolution of the region during development which is facilitated by small scratches formed around the region before development; and undesirable decrease in the image area due to dissolution of micro-area images such as dots and thin line from the side faces thereof during development.

Alternatively, a method of improving the solubilization resistance to alkali developers in the area closer to the surface, by introducing a polar group such as water into the recording layer from the surface, has been studied [e.g., Japanese Patent Application Laid-Open (JP-A) No. 2001-133965]. However, although the method was effective in improving the sensitivity and chemical resistance to some extent, such improvements are not satisfactory, and in particular, chemical resistance is far from the satisfactory level. Further, developability is insufficient in the deeper region of the recording layer closer to the support, causing insufficient solubilization discrimination (difference in solubility between exposed and unexposed regions). Therefore, further improvement in image reproducibility has been desired.

SUMMARY OF THE INVENTION

In consideration of the aforementioned problems of the prior art, an object of the present invention is to provide an infrared laser-sensitive planographic printing plate precursor which is superior in the chemical resistance at a photosensitive layer, allowing excellent solubilization discrimination, and thus superior in image reproducibility.

After intensive studies, the inventors have discovered that it is possible to solve the above-described problems by forming a recording layer that contains a polymer having a particular structure and an acid coloring dye, thereby completing the invention.

Namely, the planographic printing plate precursor according to the invention comprises: a support; and a photosensitive layer formed on the support and containing a polymer having the structural unit represented by the following Formula (1) and an acid coloring colorant represented by the following Formula (2).

Formula (1)

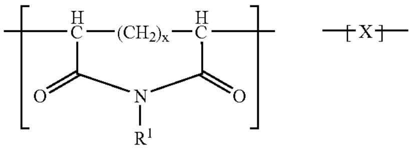

(A) (B)

Formula (2)

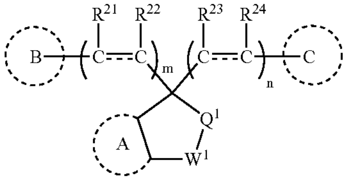

In Formula (1) above, X represents a bivalent connected group, and $R^1$ represents an alkyl or aryl group. x is 0 or 1.

In Formula (2) above, rings A, B and C each independently represent a mono- to tri-nuclear aromatic hydrocarbon group or a heterocyclic aromatic group; and at least one of the rings B and C is substituted with at least one substituent selected from the group consisting of amino, alkoxy, aryloxy, alkylthio, and arylthio groups; Rings B and C may bind to each other via a binding group.

$W^1$ represents a carbonyl or thiocarbonyl group, or $-C(R^{25})=N-$, wherein $R^{25}$ represents a hydrogen atom or a hydrocarbon group, and $Q^1$ represents an oxygen or sulfur atom or an imino group. $R^{21}$ to $R^{24}$ each independently represent a hydrogen atom or a hydrocarbon group. m and n are each independently 0 or 1.

In the infrared laser-sensitive planographic printing plate according to the invention, hard image regions superior in chemical resistance are formed in the unexposed region, not only due to the excellent chemical resistance of the polymer having a particular structure present in the photosensitive layer but also due to the high dissolution-suppressing effect caused by interaction between the polymer and the acid coloring colorant. In addition, in the exposed region, the acid coloring colorant present together with the polymer having a specific structure functions as a solubilization accelerator, because the acid coloring colorant, generates acid by decomposition.

In the infrared laser-sensitive planographic printing plate according to the invention, with the aforementioned functions having being effected in combination, the interactions which originally existed in the photosensitive layer and contributed to maintaining the development-suppressing effect are rapidly released, whereby favorable solubility in the developer is achieved and excellent solubilization discrimination and high image reproducibility are resulted. That is, the infrared laser-sensitive planographic printing plate according to the invention can release interactions between the chemical components of the recording layer, at an exposed region thereof, in a significantly improved manner, as compared with the prior art.

The invention provides an infrared laser-sensitive planographic printing plate precursor which is superior in each of the chemical resistance of photosensitive layer, solubilization discrimination, and image reproducibility.

DETAILED DESCRIPTION OF THE INIVENTION

Hereinafter, the present invention will be described in detail.

The infrared laser-sensitive planographic printing plate precursor to which the method according to the invention is applied comprises a polymer having the structural unit represented by Formula (1) (hereinafter, which polymer will be referred to as a "specific polymer") and an acid coloring colorant represented by Formula (2) in the photosensitive layer. The specific polymer, as a characteristic component of the planographic printing plate precursor, will be described first.

(Polymer Having the Structural Unit Represented by Formula (1))

Formula (1)

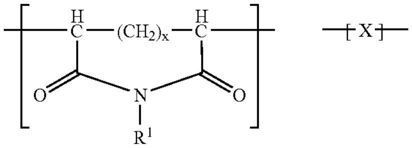

(A) (B)

In Formula (1), X represents a bivalent connected group, and $R^1$ represents an alkyl or aryl group. x is 0 or 1. Thus, the specific polymer is a polymer having a partial structure (A) and a partial structure (B).

In the partial structure (B), X preferably represents an alkylene group or a binding group represented by the following Formula (1-2) or (1-3):

Formula (1-2)

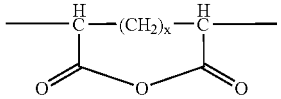

Formula (1-3)

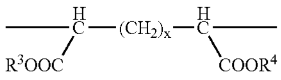

In Formula (1-2) or (1-3), x is each independently 0 or 1. In Formula (1-3), $R^3$ and $R^4$ each independently represent a hydrogen atom or an alkyl group.

When X represents an alkylene group, the alkylene groups is preferably an alkylene group having 1 to 10 carbon atoms, more preferably, having 1 to 6 carbon atoms, still more preferably having 1 to 4 carbon atoms, and most preferably —$CHR^2$—$CH_2$— (wherein, $R^2$— represents a hydrogen atom or a substituent group similar to those exemplified below as the substituents that may be introduced into the alkylene group).

Although the alkylene group may be substituted, two or more of the substituent groups on the alkylene group do not bind to each other forming a ring structure, and the alkylene group does not have an alicyclic hydrocarbon structure therein. Examples of the substituent groups that may be introduced onto the alkylene group include halogen atoms, hydroxy, alkyl, alkoxy and phenyl groups, and the like; and these substituent groups may further substituted similarly.

$R^1$ represents an alkyl or aryl group.

When $R^1$ represents an alkyl group, the alkyl group may be the one having a straight-chain, branched-chain, or cyclic structure. More specifically, when $R^1$ represents an alkyl group, $R^1$ is preferably an alkyl group having 1 to 20 carbon atoms, more preferably having 1 to 16 carbon atoms, and most preferably having 1 to 12 carbon atoms.

The alkyl and aryl groups may be substituted respectively, and if the substituent has a cyclic structure, the cyclic structure may be a heterocyclic ring structure having one or more heteroatoms, but is preferably an alicyclic structure or an aromatic ring structure.

Preferable examples of the alkyl or aryl group having the alicyclic structure include a group selected from cycloalkyl, cycloalkenyl and cycloalkynyl groups. Preferable alicyclic groups are those in which the number of the atoms constituting the ring is 5 or 6. In particular, six-membered rings are favorable. The preferable alicyclic ring is specifically a group selected from cycloalkyl and cycloalkenyl groups (preferably a cycloalkyl group). Cyclopentyl and cyclohexyl are especially preferable. Among them, cyclohexyl is particularly preferable. When $R^1$ represents an aryl group, it is preferable a phenyl group.

When the $R^1$ is substituted, the substituent groups that may be introduced is, for example, a hydroxy group, alkoxy and hydroxyalkyloxy groups that may be substituted, and —$SO^2NR^4R^5$ groups (wherein, $R^4$ and $R^5$ each independently represent a hydrogen atom or an alkyl group, preferably a hydrogen atom), and the like.

In addition, a functional substituent group for providing the polymer having the structural unit represented by Formula (1) with another function may be introduced onto the substituent group of $R^1$. Examples of such functional groups include groups having a radiation-sensitive atom or group, groups increasing the heat sensitivity of polymer compound, groups containing a colorant, groups containing an ethylenic unsaturated double bond such as acrylate, and groups which improves adhesion of the polymer compound to the support.

As described above, the substituent group favorably introduced onto $R^1$ is generally a hydroxy group, an alkoxy group that may be substituted, a hydroxyalkyl group that may be substituted or a —$SO_2NR^6R^7$ group; and the particularly preferably substituent group is a hydroxy group or a —$SO^2NR^6R^7$ group. $R^6$ and $R^7$ each independently represent a hydrogen atom or an alkyl group.

When $R^1$ represents a phenyl group, the substituent group is favorably introduced at the C4 position.

As described above, $R^1$ may have any one or more substituents, but is preferably unsubstituted or have only one substituent group introduced.

The polymer according to the invention having the structural unit represented by Formula (1) may be a polymer consisting only of the structural unit described above, but is preferably a copolymer having plural (types of) structural units. The plural structural units may be either a combination of the structural units represented by the same Formula (1) but different from each other or a combination of a structural unit represented by Formula (1) and another different structural unit.

Examples of the other different structural units for use include (meth) acrylic acid and others, and the content of the structural unit represented by Formula (1) is preferably 5 wt % or more, more preferably, 10 wt % or more, in all polymers.

The weight-average molecular weight of the polymer for use is preferably 1,000 or more and less than 500,000. The molecular weight is more preferably 2,000 or more, still more preferably 10,000 or more, and particularly preferably 100,000 or more. In addition, the molecular weight is preferably less than 400,000, more preferably less than 300,000, and still more preferably less than 200,000. The molecular weight of the polymer according to the invention may be selected according to applications freely in the range above; and, for example, a polymer having a molecular weight range of 1,000 to 2,500 or a polymer having a molecular weight range of 100,000 to 500,000 may be used favorably.

These polymers can be prepared, for example, according to the method described in Japanese Patent Application National Publication (Laid-Open) No. 2002-517786, and the polymers and the modified polymers described therein may also be used favorably for the photosensitive layer according to the invention.

It is preferable that the specific polymer is substantially insoluble in at least one, preferably at least two, more preferably at least three, of the following solvents: toluene, water, ethanol, chloroform, tetrahydrofuran and methylethylketone at 25° C. Specifically, the polymer compound above is preferably soluble at least one of the solvent described above at a concentration of less than 200 g/l, preferably less than 100 g/l, more preferably less than 50 g/l, and particularly preferably 10 g/l.

The content of the polymer in the photosensitive layer of the planographic printing plate precursor according to the invention is preferably 20 to 90 wt %, more preferably 30 to 80 wt %, and still more preferably 40 to 70 wt % as solid matter concentration.

In the photosensitive layer according to the invention, the specific polymer may be used in combination with another water-insoluble, alkali-soluble polymer. In such a case, the specific polymer according to the invention functions as an additive, and thus exerts the advantageous effects of the invention even at an addition amount of less than 20 wt %.

Examples of the water-insoluble, alkali-soluble polymers for use include one or more polymers selected from homopolymer or copolymer of hydroxystyrene, homopolymer or copolymer of acrylic acid, homopolymer or copolymer of methacrylic acid, homopolymer or copolymer of maleimide, homopolymer or copolymer of maleic anhydride, hydroxycellulose, carboxycellulose, phenolic resins, cresol resins, and the like.

Acid Coloring Colorant Represented by Formula (2)

In addition to the polymer above, the photosensitive layer according to the invention must contain an acid coloring colorant represented by Formula (2).

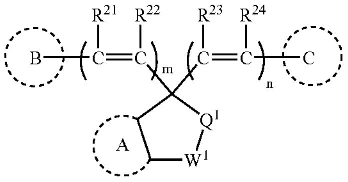

Formula (2)

In Formula (2) above, rings A, B and C each independently represent a mono- to tri-nuclear aromatic hydrocarbon group or a heterocyclic aromatic group, and at least one of the rings B and C is substituted with at least one group selected from the group consisting of amino, alkoxy, aryloxy, alkylthio, and arylthio groups. Rings B and C may bind to each other via a binding group.

$W^1$ represents a carbonyl or thiocarbonyl group, or —C($R^{25}$)═N—, wherein $R^{25}$ represents a hydrogen atom or a hydrocarbon group; and $Q^1$ represents an oxygen or sulfur atom or an imino group. $R^{21}$ to $R^{24}$ each independently represent a hydrogen atom or a hydrocarbon group. m and n are each independently 0 or 1.

Preferable examples of the acid coloring colorants represented by Formula (2) include compounds wherein $Q^1$ represents an oxygen or sulfur atom; $W^1$ represents a carbonyl or thiocarbonyl group; ring A represents a benzene, piperazine, thiophene, benzothiophene, furan, benzofuran, indole, or pyridine ring; rings B and C each independently represent a benzene or naphthalene ring; each of m and n is 0 or 1; $R^{21}$ to $R^{24}$ each independently represent a hydrogen atom, an alkyl group having 1 to 5 carbon atoms, or an aryl group having 6 to 8 carbon atoms; and $R^{25}$ represents a hydrogen atom, an alkyl group having 1 to 15 carbon atoms, or an aryl group having 6 to 15 carbon atoms. Among them, more preferable are compounds wherein $Q^1$ represents an oxygen atom; $W^1$ represents a carbonyl group; ring A represents a benzene ring; and $R^{21}$ to $R^{24}$ each independently represent a hydrogen atom, or a methyl, ethyl, or phenyl group.

In addition, rings A, B, and C may have one or more substituents, unless the substituents impair the advantageous effects of the invention. Examples of the substituent groups that may be introduced include a hydroxyl group, halogen atoms, a cyano group, a trimethylsilyloxy group, alkyl groups having 1 to 15 carbon atoms, acyl groups having 2 to 15 carbon atoms, alkoxy groups having 1 to 15 carbon atoms, alkylthio groups having 1 to 15 carbon atoms, alkylsulfinyl groups having 1 to 15 carbon atoms, alkylsulfonyl groups having 1 to 15 carbon atoms, aryloxy groups having 6 to 15 carbon atoms, arylthio groups having 6 to 15 carbon atoms, acyloxy groups having 2 to 15 carbon atoms, alkoxycarbonyl groups having 2 to 15 carbon atoms, an amino group, and the like; and these substituent groups may be additionally substituted with any one of the substituents described above. Among these substituent groups, a hydroxyl group, chlorine and bromine atoms, a trifluoromethoxy group, alkyl groups having 1 to 10 carbon atoms, a phenyl group, a tolyl group, acyl groups having 2 to 5 carbon atoms, acyloxy groups having 2 to 5 carbon atoms, dialkylamino groups having 1 to 5 carbon atoms, alkylamino groups having 1 to 5 carbon atoms, a phenylamino group, a phenylmethylamino group, alkoxy groups having 1 to 5 carbon atoms, alkylthio groups having 1 to 5 carbon atoms, a phenoxy group, a phenylthio group, and the like are more preferable.

In addition, rings B and C may bind to each other via a binding group, and in such a case, examples of the binding groups include oxygen and sulfur atoms and methylene and ethylene groups; and preferable is an oxygen atom.

When rings B and C are bound to each other, m and n are both 0, and the rings B and C are preferably bound to each other at the o-site thereof, to form a six-membered ring.

In Formula (2), at least one of the ring B and C has at lease one substituent group selected from amino, alkoxy, aryloxy, alkylthio, and arylthio groups. Each of the rings B and C preferably has a substituent group and it may have two or more substituents. The compound having at least one amino group both on the rings B and C are more preferable. The substituent group selected from amino, alkoxy, aryloxy, alkylthio, and arylthio group described above may have additionally a substituent group that may be introduced onto the rings A, B, and C.

A compound having plural colorants wherein two or more of the acid coloring colorants represented by Formula (2) are bound to each other directly or via a binding group may be used as the acid coloring colorant according to the invention. The method of coupling plural acid coloring colorants is not particularly limited, as long as the acid coloring colorants are bound to each other directly or via a binding group. In a case in which the compound having plural acid coloring colorants is an organic polymer, the weight-average molecular weight (Mw) of the polymer is 1,000 to 1,000,000, preferably 1,000 to 500,000, and still more preferably 1,000 to 100,000.

Use of the organic polymer substance having plural acid coloring colorants is preferable because the polymer substance has superior coating properties by itself, the plural acid coloring colorants are localized in the molecule thereof and thus are preferable in terms of effectiveness. Hereinafter, typical examples of the acid coloring colorants favorably used in the invention will be listed, but the invention is not restricted thereby.

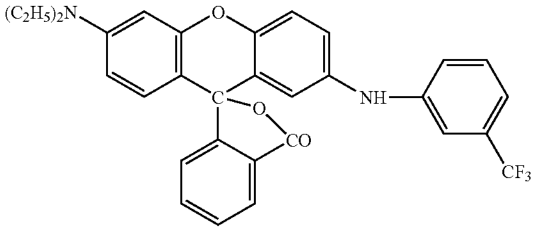

-continued
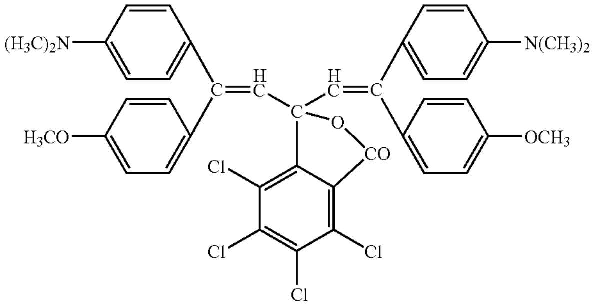
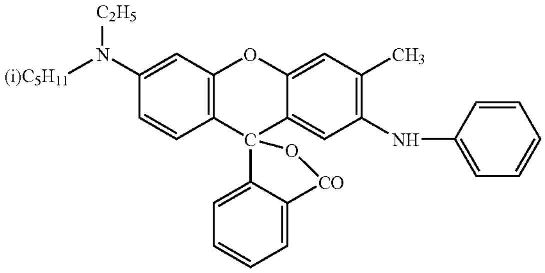
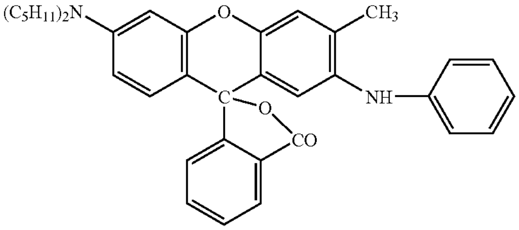
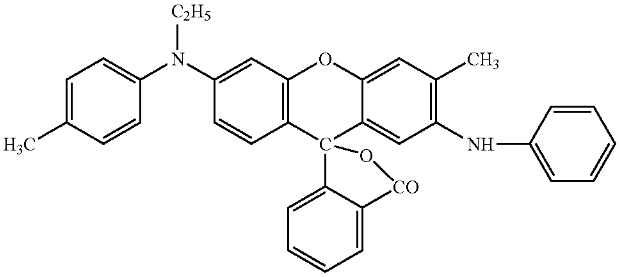
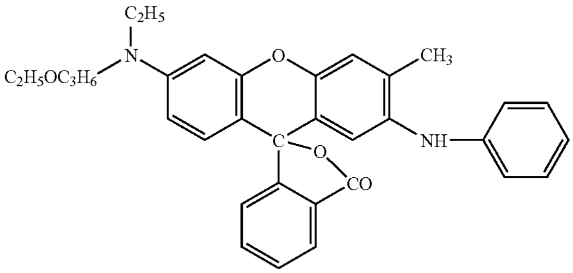

-continued
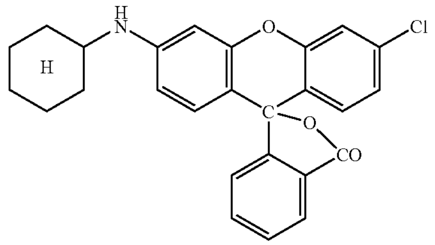
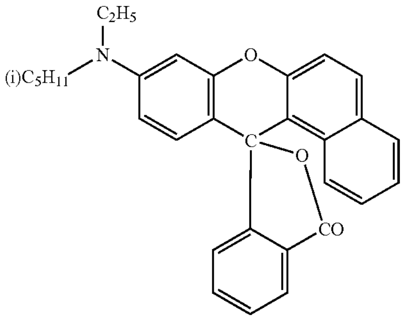
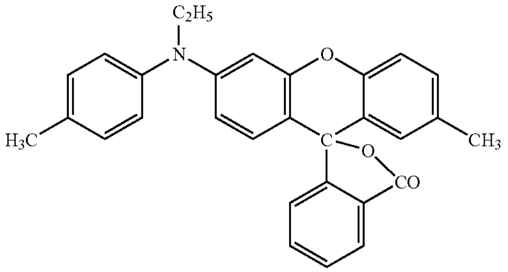
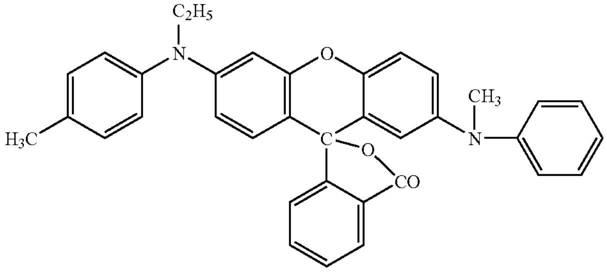
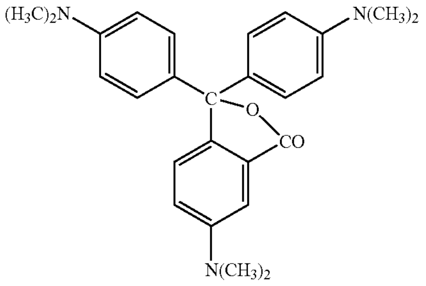

-continued
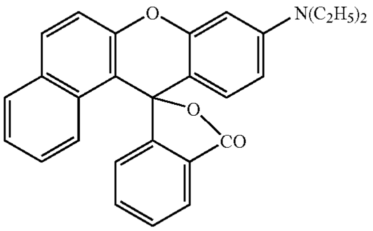
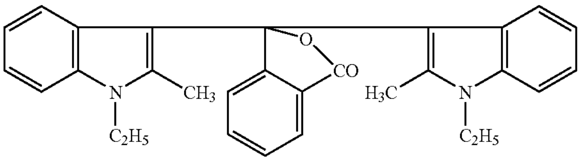
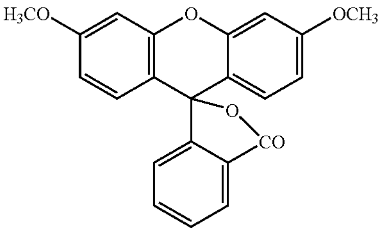
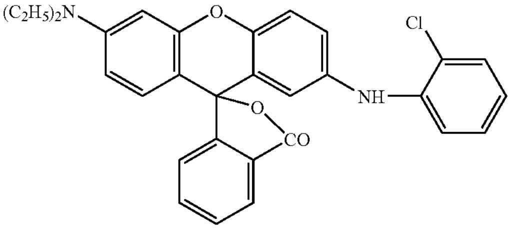
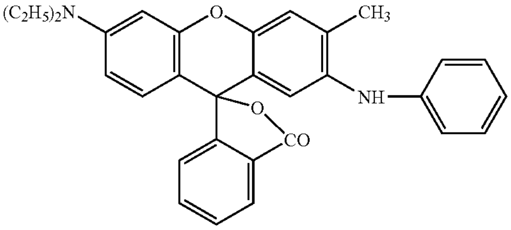
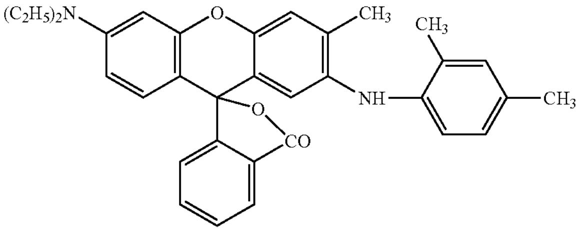

-continued
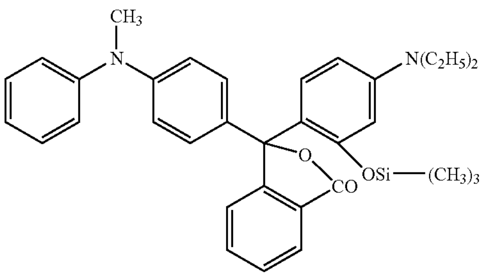
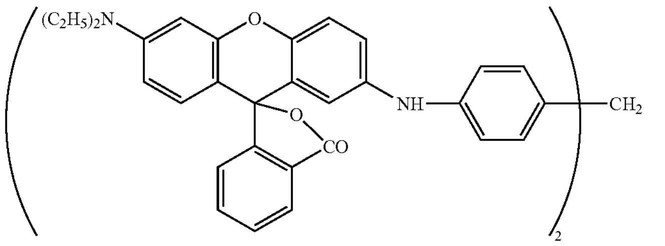
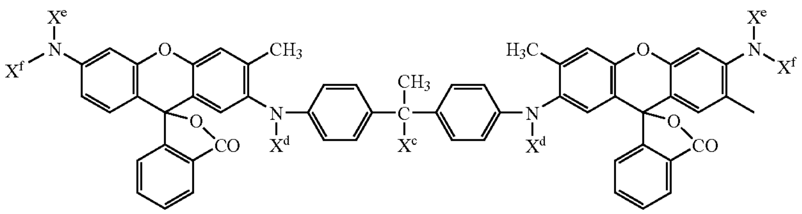
| | $X^d$ | $X^c$ | $X^e$ | $X^f$ |
|---|---|---|---|---|
| 1 | H | H | 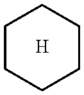 | $CH_3$ |
| 2 | H | $CH_3$ | 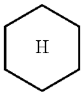 | $CH_3$ |
| 3 | $CH_3$ | H | 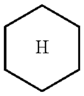 | $CH_3$ |
| 4 | $CH_3$ | $CH_3$ | 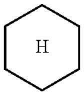 | $CH_3$ |
| 5 | H | $CH_3$ | $CH_3$ | $CH_3$ |

-continued
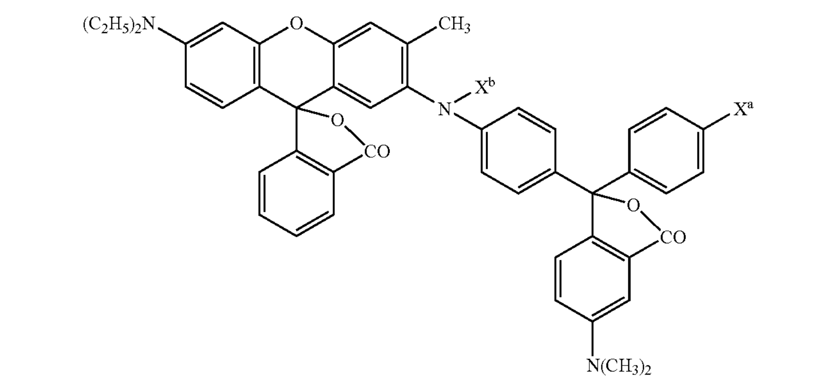
| | $X^a$ | $X^b$ |
|---|---|---|
| 1 | 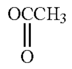 | H |
| 2 | OH | H |
| 3 | OH | $CH_3$ |
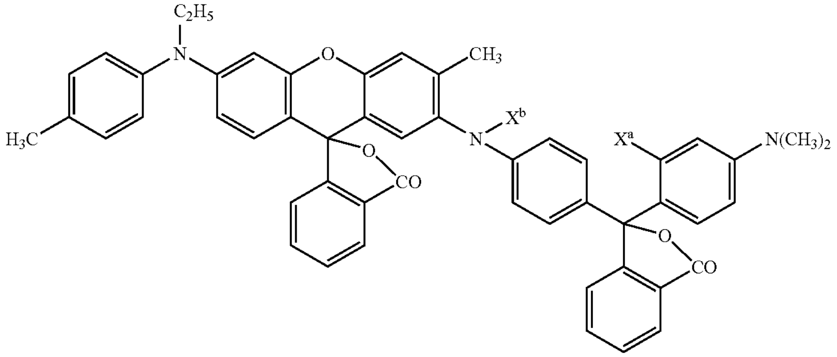
| | $X^a$ | $X^b$ |
|---|---|---|
| 1 | 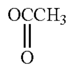 | H |
| 2 | OH | $CH_3$ |
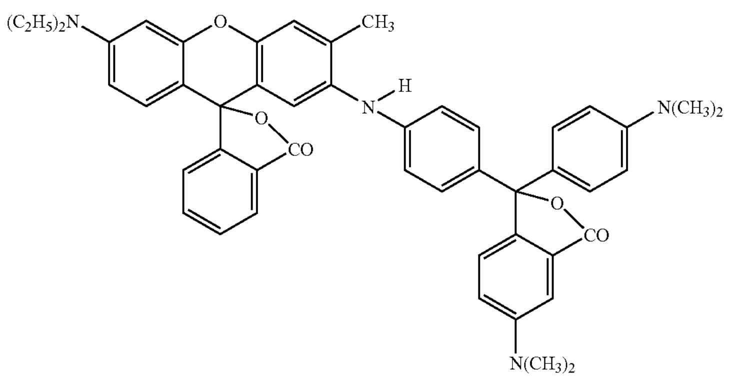

-continued
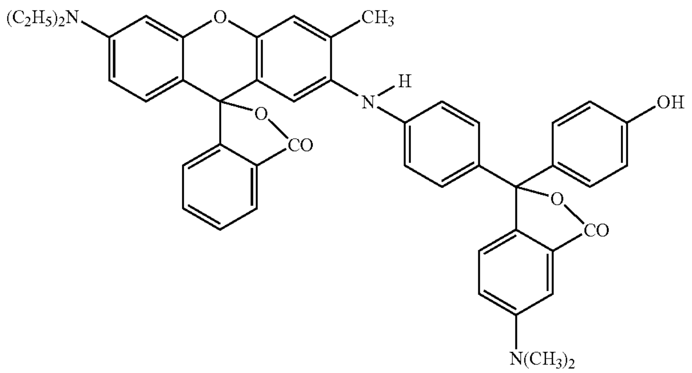
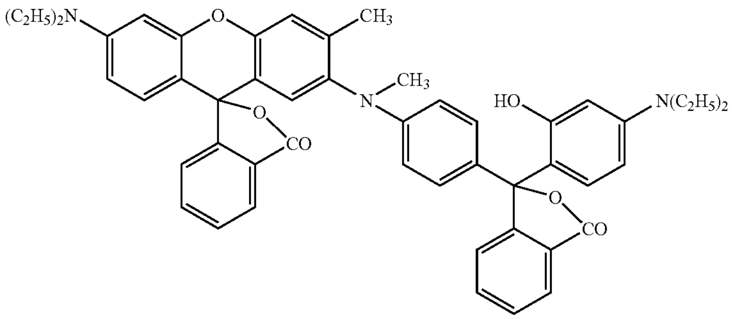
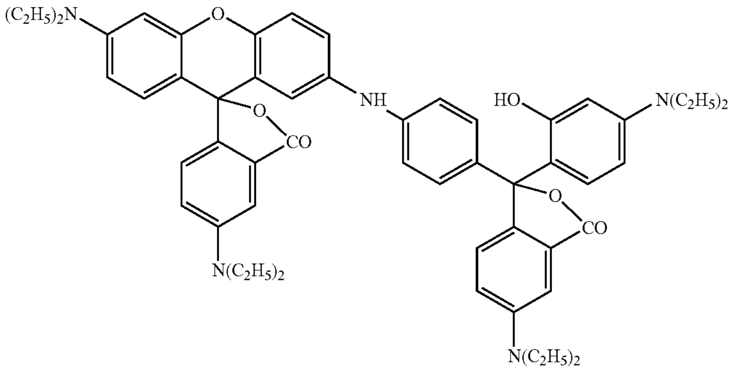
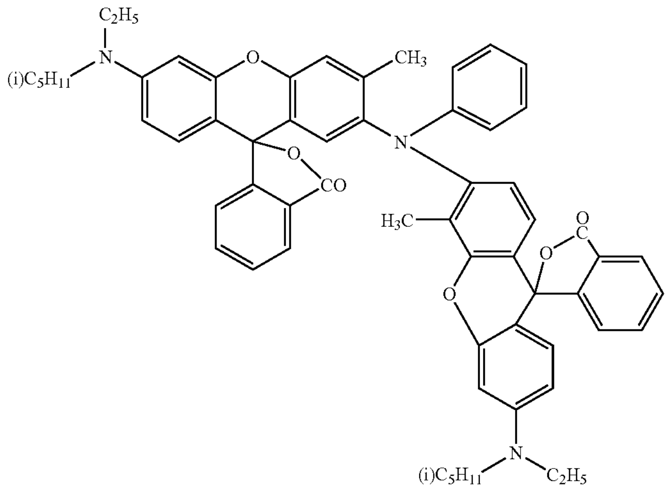

-continued
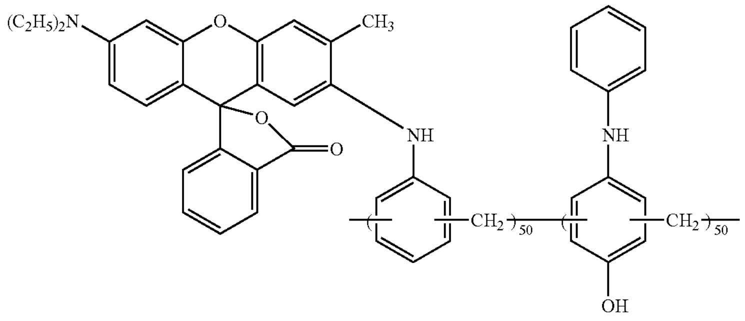
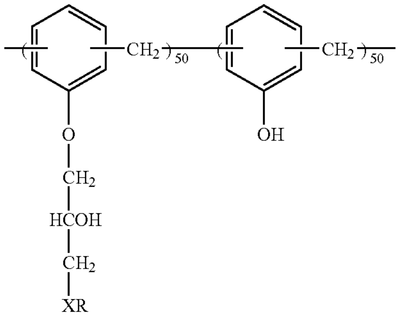
XR:
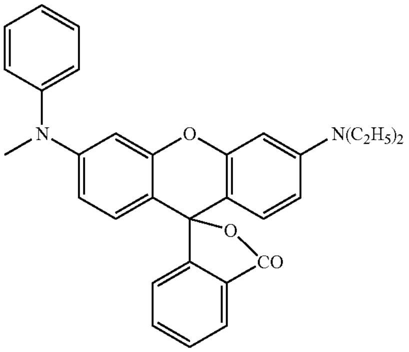
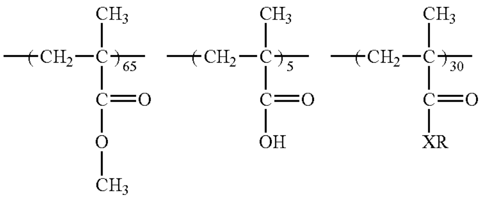
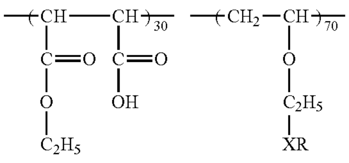
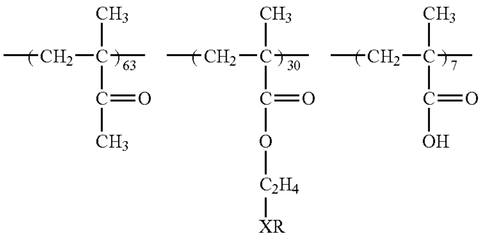

-continued
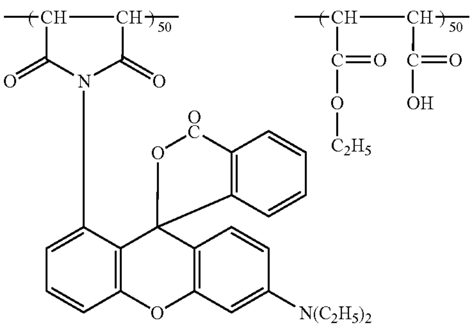
XR:
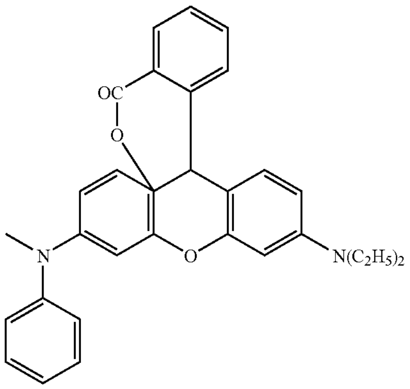
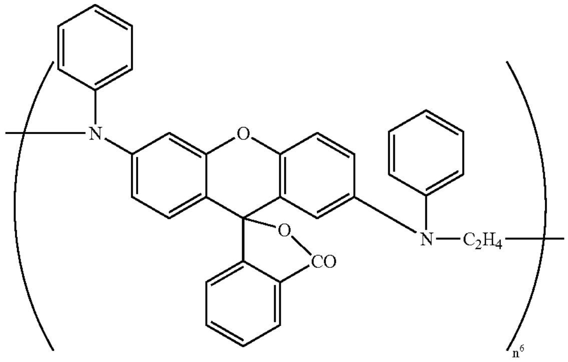
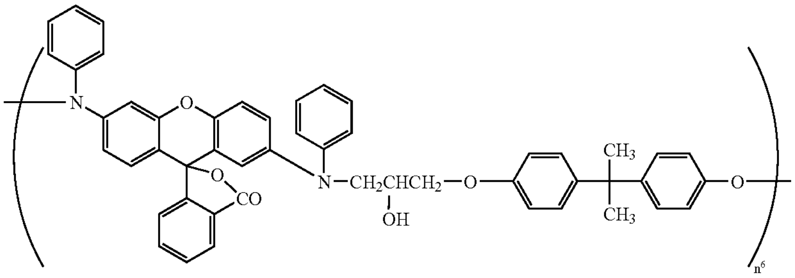

-continued

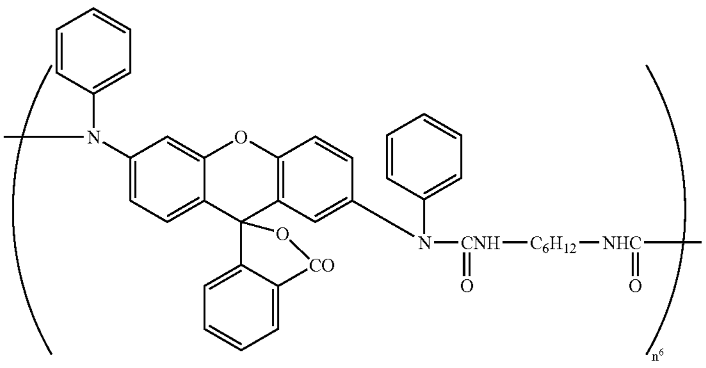

The content of the acid coloring colorant is preferably in the range of 1 to 50 wt %, more preferably 3 to 40 wt %, and still more preferably 5 to 25 wt %, with respect to the total solid matters in the composition for the photosensitive layer. When the acid coloring colorant is an organic polymer (normally, weight-average molecular weight Mw: 1,000 to 100,000), the content thereof is in the range of 1 to 95 wt %, preferably 3 to 90 wt %, and still more preferably 5 to 80 wt %, with respect to the total solid matters in the photosensitive layer.

In the invention, an infrared absorbent is preferably added to the positive-type photosensitive layer for improvement in sensitivity. The infrared absorbent used for that purpose is not particularly limited as long as it is a substance that absorbs photo-energy irradiation and generates heat. Various dyes or pigments known as infrared absorbing dyes or pigments having the absorption maximum at a wavelength of 700 nm to 1,200 nm are preferable from the viewpoint of compatibility with easily available high-output lasers.

The dyes may be commercially available ones and known ones described in publications such as "Dye Handbook" (edited by the Society of Synthesis Organic Chemistry, Japan, and published in 1970). Specific examples thereof include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squarylium dyes described in JP-A No. 58-112792; and cyanine dyes described in GB Patent No. 434,875.

Other preferable examples of the dye include near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squarylium dyes, pyrylium salts, thiopyrylium dyes, and nickel thiolate complexes. Dyes represented by the following general formulae (a) to (e) are also preferable since such dyes are excellent in terms of photothermal conversion efficiency. The cyanine dyes represented by the following general formula (a) are most preferable for the following reason: when the dyes are used in the photosensitive composition of the invention, the dyes manifest a high degree of interaction with the alkali-soluble resin, and the dyes are also excellent in terms of stability and economy.

General formula (a)

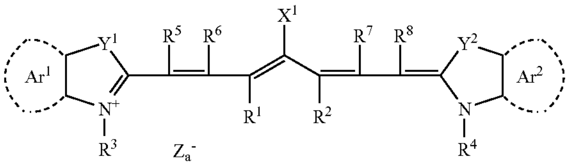

In general formula (a), $X^1$ represents a hydrogen atom, a halogen atom, —$NPh_2$, $X^2$-$L^1$ (wherein $X^2$ represents an oxygen atom or a sulfur atom, $L^1$ represents a hydrocarbon group having 1 to 12 carbon atoms, an aromatic cyclic group having a heteroatom, or a hydrocarbon group containing a heteroatom and having 1 to 12 carbon atoms, and the heteroatom referred to herein is N, S, O, a halogen atom, or Se), or a group represented by the following:

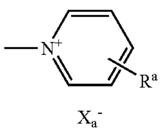

where $Xa^-$ has the same definition as $Za^-$, which will be described at a later time, and $R^a$ represents a substituent selected from a hydrogen atom, an alkyl group, an aryl group, a substituted or unsubstituted amino group, or a halogen atom;

In the general formula (a), $R^1$ and $R^2$ each independently represents a hydrocarbon group having 1 to 12 carbon atoms, and from the viewpoint of the storage stability of the photosensitive composition of the invention when it is used in a coating solution for forming a recording layer of a planographic printing plate precursor, it is preferable that $R^1$ and $R^2$ each independently represents a hydrocarbon group having 2 or more carbon atoms, and more preferably $R^1$ and $R^2$ are bonded to each other to form a 5-membered or 6-membered ring.

$Ar^1$ and $Ar^2$, which may be the same or different, each represent an aromatic hydrocarbon group which may have a substituent. Preferable examples of the aromatic hydrocarbon group include benzene and naphthalene rings. Preferable examples of the substituent include hydrocarbon groups having 12 or less carbon atoms, halogen atoms, and alkoxy groups having 12 or less carbon atoms.

$Y^1$ and $Y^2$, which may be the same or different, each represents a sulfur atom, or a dialkylmethylene group having 12 or less carbon atoms.

$R^3$ and $R^4$, which may be the same or different, each represents a hydrocarbon group which has 20 or less carbon atoms and may have a substituent. Preferable examples of the substituent include alkoxy groups having 12 or less carbon atoms, a carboxyl group, and a sulfo group. $R^5$, $R^6$, $R^7$ and $R^8$, which may be the same or different, each represents a hydrogen atom, or a hydrocarbon group having 12 or less carbon atoms, and since the raw materials thereof can easily be obtained, each preferably represents a hydrogen atom.

$Za^-$ represents a counter anion. However, in a case where the cyanine dye represented by general formula (a) has an anionic substituent in the structure thereof and there is accordingly no need to neutralize electric charges in the dye, $Za^-$ is not required. From the viewpoint of the storage stability of the recording layer coating solution, $Za^-$ is preferably an ion of a halogen, perchlorate, tetrafluroborate, hexafluorophosphate, carboxylate or sulfonate. Particularly preferable are ions of perchlorate, hexafluorophosphate, and arylsulfonate.

Specific examples of the cyanine dye represented by general formula (a), which can be preferably used in the invention, include dyes in JP-A No. 2001-133969 (paragraphs [0017] to [0019]), JP-A No. 200240638 (paragraphs [0012] to [0038]), and JP-A No. 2002-23360 (paragraphs [0012] to [0023]).

The pigment used as the infrared absorbent in the invention may be a commercially available pigment or a pigment described in publications such as Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

These pigment or dye can be added to the photosensitive composition in a ratio of 0.01 to 50%, preferably 0.1 to 10%, and more preferably 0.5 to 10% (in the case of the dye) or 0.1 to 10% (in the case of pigment) by mass, relative to the total solid contents which constitute the photosensitive composition.

When an amount of the pigment or dye added is less than 0.01 wt %, sensitivity may deteriorate, while when the amount is more than 50 wt %, the uniformity and the durability of image-recording layer may deteriorate. The dye or pigment may be added to the same layer together with other components, or to another layer separately.

Examples of the compound for use as the solubilization inhibitor in the photosensitive layer according to the invention include compounds containing at least one nitrogen atom quaternarized and/or incorporated in a heterocyclic ring; triarylmethane compounds; compounds having a carbonyl functional group; compounds represented by Formula $Q^3$-S(O)a-$Q^4$ (wherein, $Q^3$ represents a phenyl or alkyl group that may be arbitrarily substituted; a is 0, 1 or 2; and $Q^4$ represents a halogen atom or an alkoxy group); ferrocenium compounds; and the like. Typical examples preferable among them are one or more selected from quinoline compounds, triazole compounds, imidazoline compounds, quinolinium compounds, benzothiazolium compounds, pyridinium compounds, flavone compounds, ethyl p-toluenesulfonate, p-toluenesulfonylchloride, and an acridine orange base (CI Solvent Orange 15).

As described above, the solubilization inhibitor is not necessarily needed, when an infrared absorbent which is capable of suppressing solubilization is used. If the solubilization inhibitor is used, a content thereof is in the range of 0.1 to 50 wt % and more preferable in the range of 1 to 30 wt %.

The photosensitive layer according to the invention may contain any other additive components such as surfactant, colorant, photochromic dye, acid generator, and others, respectively, in ranges that do not impair the advantageous effects of the invention.

(Production of Planographic Printing Plate Precursor)

The planographic printing plate precursor according to the invention is produced by dissolving or dispersing the components for the lower layer described above, the components for the positive-type image-recording layer, and the components for the coating solution described below of a desired layer, respectively in solvents and coating and drying the coating solutions on a suitable support.

Any known, commonly-used organic solvent may be used as the coating solvent for the dissolving and coating processes of the image-recording layer according to the invention. Typical examples of the favorable solvents include 1-methoxypropan-2-ol, ethyl alcohol, n- or iso-propyl alcohol, acetone, methylethylketone, benzene, toluene, xylene, cyclohexane, methoxybenzene, isopropylether, n-butylether, dioxane, dimethyldioxane, tetrahydrofuran, ethylene glycol, methylcellosolve, methoxymethoxyethanol, diethylene glycol monomethylether, dimethylsulfoxide, N,N-dimethylformamide; and the like, and these solvents may be used alone or as a mixture. The concentration of solid matters in the coating composition is suitably 2 to 50 wt %.

Any one of the supports for planographic printing plate precursors commonly used in the art may be used as the support for the planographic printing plate precursor according to the invention without restriction. Generally, plate-shaped supports are used, but any types of supports, for example in the cylindrical shape, may be used if printable.

The support preferably has a hydrophilic surface for application of dampening water in printing. Alternatively, for applications in waterless printing, the support preferably has an ink-repellent surface lower in surface energy that is suitable for that purpose.

The support may be made of a metal or a nonmetal, and if it contains a metal film, the metal film is preferably a film of aluminum, zinc, titanium, or the like, and aluminum is particularly preferable. The support may contain an alloy of the metals described above. Other alloys for use include brass, and, steel (e.g., stainless steel), and the like.

Examples of the nonmetal supports include supports having a film of plastic, paper, or the like, and the favorable plastic resin is polyester, in particular polyethylene terephthalate. Alternatively, the support may be a laminate of a metal film and a nonmetal film.

The support may be finished on the surface for improvement in hydrophilicity or ink repellency.

The planographic printing plate precursor produced as described above is normally subjected to image exposure and development. The light source for the activation light used for image exposure is preferably a light source having an emission wavelength in the near-infrared to infrared region, and solid state laser and semiconductor laser are particularly preferable.

The developer which may be applied to the developing treatment of the planographic printing plate precursor of the invention is a developer having a pH range from 9.0 to 14.0 and preferably a pH range from 12.0 to 13.5. As the developer (hereinafter referred to as a developer including a replenishing solution), a conventionally known aqueous alkali solution may be used.

Examples of the alkali agent include inorganic alkali salts such as sodium silicate, potassium silicate, trisodium phosphate, tripotassium phosphate, triammonium phosphate, disodium hydrogenphosphate, dipotassium hydrogenphosphate, diammonium hydrogenphosphate, sodium carbonate, potassium carbonate, ammonium carbonate, sodium hydrogencarbonate, potassium hydrogencarbonate, ammonium hydrogen carbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents may be used alone or in combinations of two or more thereof.

Among the above aqueous alkali solutions, one developer which exerts the effect of the invention is an aqueous solution of a pH 12 or higher so-called "silicate developer" containing alkali silicate as a base, or containing alkali silicate obtained by mixing a base with a silicon compound, and the other more preferable developer is a so-called "non-silicate developer" which does not contain alkali silicate, and contains a non-reducing sugar (organic compound having buffering action) and a base.

In the former, developability of an aqueous solution of alkali metal silicate can be regulated by a ratio (generally expressed by mole ratio of $[SiO_2]/[M_2O]$) of silicon oxide $SiO_2$ and alkali metal oxide $M_2O$. For example, an aqueous solution of sodium silicate in which a mole ratio of $SiO_2/Na_2O$ is 1.0 to 1.5 (that is, $[SiO_2]/[Na_2O]$ is 1.0 to 1.5), and a content of $SiO_2$ is 1 to 4% by mass as disclosed in JP-A No. 54-62004; and an aqueous solution of alkali metal silicate in which $[SiO_2]/[M]$ is 0.5 to 0.75 (that is, $[SiO_2]/[M_2O]$ is 1.0 to 1.5), a concentration of $SiO_2$ is 1 to 4% by mass, and the developer contains at least 20% potassium using gram atom of a total alkali metal present therein as a standard, as described in Japanese Patent Application Publication (JP-B) No. 57-7427 are preferably used.

In order to enhance or inhibit the developability, to disperse development scum, or to enhance the ink affinity of a printing plate image portion, as need arises, various kinds of surfactants and organic solvents can be added to the developer. Preferable examples of the surfactant include anionic, cationic, nonionic and amphoteric surfactants.

The photosensitive planographic printing plate developed with a developer having such a composition as described above is post-processed with washing water, a rinse solution containing a surfactant and a finisher or a protective rubber solution containing as the main components gum Arabic, a starch derivative and the like. Post-treatments for the post-processing of the photosensitive planographic printing plate of the invention can be combined in various manners, depending on applications.

Recently, for rationalization or standardization of the printing plate production work in printing plate-producing or printing industries, automatic developing apparatuses for photosensitive printing plates have been used widely. An automatic developing apparatuses generally comprise a development section and a post-treatment section. More specifically, an automatic developing apparatus includes a unit for transferring the printing plates, tanks for respective treatment solutions, and a spraying apparatus. The automatic developing apparatus transfers the exposed printing plates horizontally and at the same time carries out development treatment and post-development treatments by spraying the respective treatment solutions pumped up by pumps, to the printing plate, through spray nozzles.

Also known are the development method by feeding and immersing a PS plate in a processing solution tank filled with a processing solution one after another by means of the submerged guide rolls or the like, and the development method by washing the plate surface by supplying a certain small amount of washing water thereon after development and reusing the waste water as the dilution water for developer concentrate.

In such automatic treatment, the replenishers may be replenished to the respective treatment solutions depending on the treatment quantity, operation times, and the like. Alternatively, so-called disposable treatment method in which treatment is carried out using substantially unused treatment solutions can be employed.

The planographic printing plates obtained after these treatments are then applied to an offset printing machine or the like, wherein they are used for printing numerous papers.

EXAMPLES

Hereinafter, the present invention will be described with reference to Examples, but it should be understood that the scope of the invention is not restricted by these Examples.

Synthesis Example 1

Synthesis of Specific Polymer 1: N-(p-phenylsulfonamide)-substituted (methylvinylether/maleimide)copolymer 20 wt % solution (156 g) of Gantrez AN119 (trade name, molecular weight: 190,000, linear methylvinylether/maleic anhydride copolymer, manufactured by ISP, US) in anhydrous n-methylpyrrolidone (NMP) was placed in a beaker, and the copolymer was diluted with additional anhydrous NMP (300 g). After dilution, p-aminobenzenesulfonamide (hereinafter, referred to as "sulfanilamide", 34.46 g) was added and dissolved therein while the solution was stirred. Then, dimethylaminopyridine (0.2 g) was added to the solution, and the resulting solution was stirred at room temperature for 45 minutes and then heated in a hot water bath at 90 to 95° C. for 1 hour. The mixture was allowed to cool and left overnight.

10 ml of conc. hydrochloric acid and 2 liters of distilled water were placed and stirred thoroughly in a 3-liter beaker; the reaction polymer mixture obtained above was fed very slowly, as a narrow flow, into the 3-liter beaker while stirred, to give a desired product (specific polymer 1 having the following structure), which precipitated as a yellowish brown-pink suspension. The mixture was stirred additionally for 2 hours and the precipitate was allowed to settle. The precipitate was filtered, resuspended in 2 liters of water for 2 hours, filtered again, and dried in a fan oven overnight, to give dark brown granules (48.4 g: yield 78.0%).

FTIR analysis of the obtained polymer 1 showed imide C—N—C stretching vibration, indicating presence of a cyclic imide group. A very weak peak therein shows presence of the N—H group in an amide group, indicating presence of a hydrolyzed or ring-opened product present of a small content.

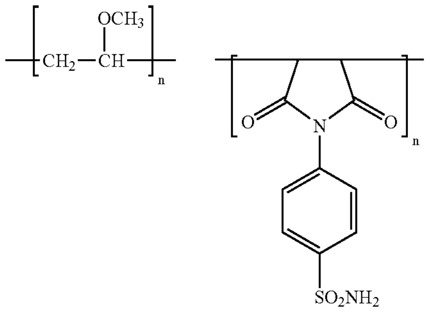

Specific polymers 2 to 10 were also prepared from the reagents shown below, in a similar manner to the scheme described in Synthesis example 1. However, specific polymers 3 to 10 were prepared in an acid-catalyzed reaction, in contrast to the specific polymers 1 and 2 prepared in a base-catalyzed reaction.

Synthesis Example 2

Synthesis of Specific Polymer 2: N-(p-hydroxyphenyl)-substituted (methylvinylether/maleimide)copolymer: Yield 84.7%

Reagents Used

- Gantrez AN119 (39.03 g, 0.25 mole)
- p-Aminophenol (27.3 g, 0.25 mole)
- n-Methylpyrrolidone (300 g, 3.02 mole)
- Dimethylaminopyridine (0.4 g)

Synthesis Example 3

Synthesis of Specific Polymer 3: N-(p-phenylsulfonamide)-substituted (styrene/maleimide (1: 1))copolymer: Yield 90.3%

Reagents Used

- Styrene/maleic anhydride (1:1) copolymer (11.67 g: 0.05 mole)
- Sulfanilamide (8.62 g, 0.05 mole)
- n-Methylpyrrolidone (24.8 g, 0.25 mole)
- (Glacial) acetic acid (30.03 g, 0.5 mole)

Synthesis Example 4

Synthesis of Specific Polymer 4: N-(p-phenylsulfonamide)-substituted (styrene/maleimide (2: 1))copolymer: Yield 93.2%

Reagents Used

- Styrene/maleic anhydride (2:1) copolymer (15.32 g, 0.05 mole)
- Sulfanilamide (8.62 g, 0.05 mole)
- n-Methylpyrrolidone (24.8 g, 0.25 mole)
- (Glacial) acetic acid (30.03 g, 0.5 mole)

Synthesis Example 5

Synthesis of Specific Polymer 5: N-(p-phenylsulfonamide)-substituted (styrene/maleimide (3:1))copolymer: Yield 95.2%

Reagents Used

- Styrene/maleic anhydride (3:1) copolymer (19.74 g, 0.05 mole)
- Sulfanilamide (8.62 g, 0.05 mole)
- n-Methylpyrrolidone (24.8 g, 0.25 mole)
- (Glacial) acetic acid (30.03 g, 0.5 mole)

Synthesis Example 6

Synthesis of Specific Polymer 6: N-(p-sulfonamide)-substituted (methylvinylether/maleimide)copolymer: Yield 67.7%

Reagents Used

- Gantrez AN119 (15.61 g, 0.1 mole)
- Sulfanilamide (17.23 g, 0.1 mole)
- n-Methylpyrrolidone (46.8 g, 0.47 mole)
- (Glacial) acetic acid (46.83 g, 0.75 mole)

Synthesis Example 7

Synthesis of Specific Polymer 7: N-(p-aminophenol)-substituted (methylvinylether/maleimide)copolymer: Yield 67.7%

Reagents Used

- Gantrez AN119 (15.61 g, 0.1 mole)
- p-Aminophenol (10.92 g, 0.1 mole)
- n-Methylpyrrolidone (46.8 g, 0.47 mole)
- (Glacial) acetic acid (46.83 g, 0.75 mole)

Synthesis Example 8

Synthesis of Specific Polymer 8: mixed N-(p-sulfonamide)- and N-cyclohexyl-substituted (50:50) (methylvinylether/maleimide)copolymer: Yield 75.2%

Reagents Used

- Gantrez AN119(15.61 g, 0.1 mole)
- Sulfanilamide (8.62 g, 0.05 mole)
- Cyclohexylamine (4.91 g, 0.05 mole)
- n-Methylpyrrolidone (46.8 g, 0.47 mole)

(Glacial) acetic acid (46.83 g, 0.75 mole)

Synthesis Example 9

Synthesis of Specific Polymer 9: Mixed sulfonamide- and N-cyclohexyl-substituted (25:75) (methylvinylether/maleimide)copolymer: Yield 75.7%

Reagents Used
- Gantrez AN119 (15.61 g, 0.1 mole)
- Sulfanilamide (4.31 g, 0.03 mole)
- Cyclohexylamine (7.37 g, 0.08 mole)
- n-Methylpyrrolidone (46.8 g, 0.47 mole)
- (Glacial) cetic acid (46.83 g, 0.75 mole)

Synthesis Example 10

Synthesis of Specific Polymer 10: Mixed N-(p-sulfonamide)- and N-cyclohexyl-substituted (37,5: 62.5) (methylvinylether/maleimide)copolymer: Yield 75.4%

Reagents Used
- Gantrez AN119 (15.61 g, 0.1 mole)
- Sulfanilamide (6.46 g, 0.04 mole)
- Cyclohexylamine (6.14 g, 0.06 mole)
- n-Methylpyrrolidone (46.8 g, 0.47 mole)
- (Glacial) acetic acid (46.83 g, 0.75 mole)

Specific polymers 11 to 23 were prepared by using the principal reagents shown in the following Table 1 in a similar manner to Example 1.

TABLE 1

| Compound number | Polymer | Amine |
|---|---|---|
| 11 | Gantrez AN119 | Aminoethanol |
| 12 | Gantrez AN119 | n-Butylamine |
| 13 | Gantrez AN119 | Methoxyethylamine |
| 14 | Gantrez AN119 | Aminoethoxyethanol |
| 15 | Gantrez AN119 | Cyclohexylamine |
| 16 | Gantrez AN119 | n-Dodecylamine |
| 17 | Styrene/maleic anhydride (1:1) | Aminoethanol |
| 18 | Styrene/maleic anhydride (1:1) | p-Aminophenol |
| 19 | Styrene/maleic anhydride (1:1) | n-Butylamine |
| 20 | Styrene/maleic anhydride (1:1) | Methoxyethylamine |
| 21 | Styrene/maleic anhydride (1:1) | Aminoethoxyethanol |
| 22 | Styrene/maleic anhydride (1:1) | Cyclohexylamine |
| 23 | Styrene/maleic anhydride (1:1) | n-Dodecylamine |

Among the specific polymers prepared as described above, the structures of the specific polymers 1 to 16 are shown below.

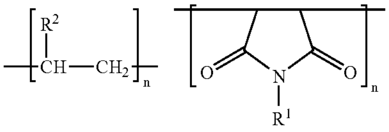

| Compound number | $R^2$ | $R^1$ |
|---|---|---|
| 1 | $—OCH_3$ | para-($H_2NSO_2$)-phenyl- |
| 2 | $—OCH_3$ | para-hydroxyphenyl- |
| 3 | -phenyl | para-($H_2NSO_2$)-phenyl- |

-continued

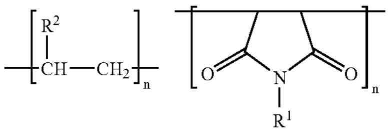

| Compound number | $R^2$ | $R^1$ |
|---|---|---|
| 4 | -phenyl | para-($H_2NSO_2$)-phenyl- |
| 5 | -phenyl | para-($H_2NSO_2$)-phenyl- |
| 6 | $—OCH_3$ | para-($H_2NSO_2$)-phenyl- |
| 7 | $—OCH_3$ | para-hydroxyphenyl- |
| 8 | $—OCH_3$ | para-($H_2NSO_2$)-phenyl-, and cyclohexyl-(50:50) |
| 9 | $—OCH_3$ | para-($H_2NSO_2$)-phenyl-, and cyclohexyl-(25:75) |
| 10 | $—OCH_3$ | para-($H_2NSO_2$)-phenyl-, and cyclohexyl-(37.5:62.5) |
| 11 | $—OCH_3$ | hydroxyethyl |
| 12 | $—OCH_3$ | n-butyl- |
| 13 | $—OCH_3$ | methoxyethyl- |
| 14 | $—OCH_3$ | hydroxyethyloxyethyl- |
| 15 | $—OCH_3$ | cyclohexyl- |
| 16 | $—OCH_3$ | n-dodecyl- |

Examples 1 to 8

Synthesis of Support

An aluminum plate having a thickness of 0.3 mm (material: 1050) was washed and degreased with trichloroethylene, and the surface was roughened with a nylon brush and an aqueous 400-mesh pumice suspension and then washed thoroughly with water. The plate was immersed and etched in an aqueous 25% sodium hydroxide solution at 45° C. for 9 seconds, washed with water, immersed in 20% nitric acid for 20 seconds, and then washed with water. The amount of etching by the surface roughening was approximately 3 $g/m^2$. Then, the aluminum plate was anodized by using 7% sulfuric acid as the electrolyte solution at an electric current density of 15 $A/dm^2$ forming an anodic oxide film having a thickness of 3 $g/m^2$, which was used as a substrate plate (support).

The following infrared laser-sensitive photosensitive layer coating solution 1 was prepared.

(Recording Layer-coating Solution 1)

Specific polymer obtained in Synthesis example (compound shown in the following Table 2) 40.0 wt %

Phenol/cresol novolak resin (having the following structure) 50.0 wt % (trade name: LB6564, manufactured by Bakelite)

Acid coloring colorant (compound shown in the following Table 2) 6.0 wt %

Dye (KF654B PINA (having the following structure) )2.0 wt % (trade name: KF654B PINA, manufactured by Riedel de Haan)

Phenylmethylsiloxane 6.0 wt % (trade name: Silikophen P50X-Essen, manufactured by Tego Chemie Service)

TABLE 2

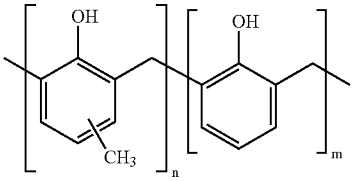

LB6564 resin

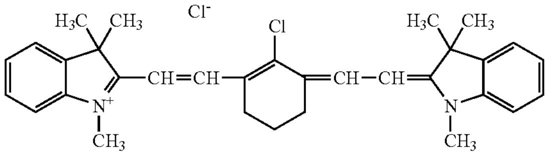

Dye: KF654B PINA

| | Photosensitive layer component | | Evaluation results | |
|---|---|---|---|---|
| | Specific polymer (comparative polymer) | Acid coloring colorant (comparative colorant) | Chemical resistance | Solubility in developer |
| Example 1 | Specific polymer 1 | TB-1 | 1% | 10 |
| Example 2 | Specific polymer 1 | TB-2 | 3% | 12 |
| Example 3 | Specific polymer 1 | TB-3 | 2% | 9.5 |
| Example 4 | Specific polymer 1 | TB-4 | 1% | 12 |
| Example 5 | Specific polymer 1 | TB-5 | 1% | 10 |
| Example 6 | Specific polymer 1 | TB-6 | 3% | 10 |
| Example 7 | Specific polymer 2 | TB-1 | 1% | 12 |
| Example 8 | Specific polymer 3 | TB-1 | 2% | 10 |
| Comparative Example 1 | Specific polymer 1 | Crystal violet | 15% | 3.5 |
| Comparative Example 2 | Cresol novolak resin | TB-1 | 40% | 10 |

The structures of the acid coloring colorants (TB-1) to (TB-6) in Table 2 above are shown below.

TB-1

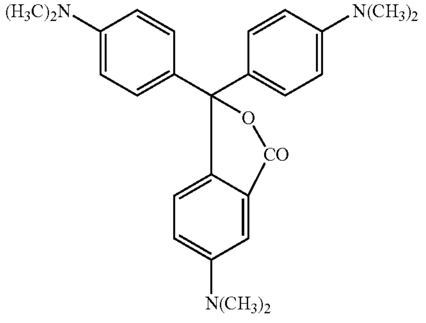

-continued

TB-2

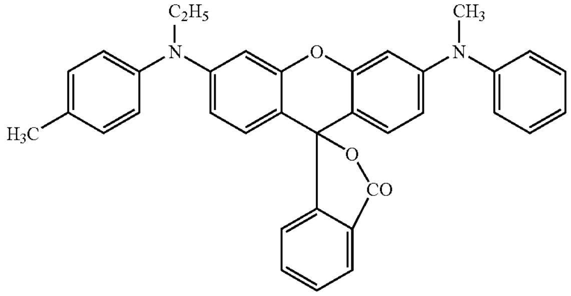

TB-3

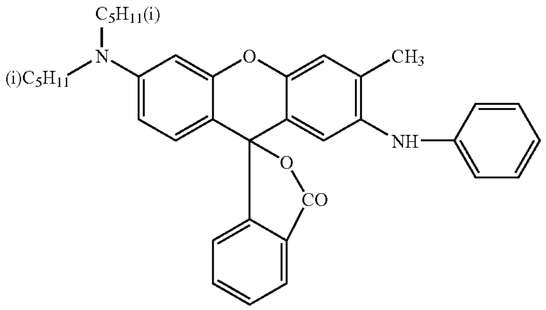

TB-4

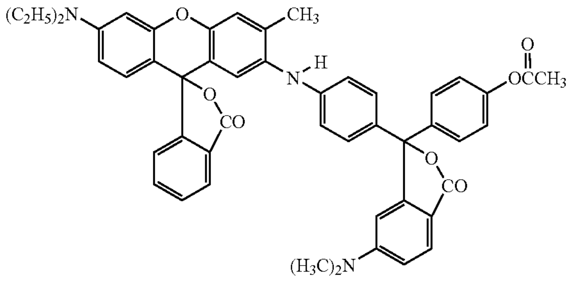

TB-5

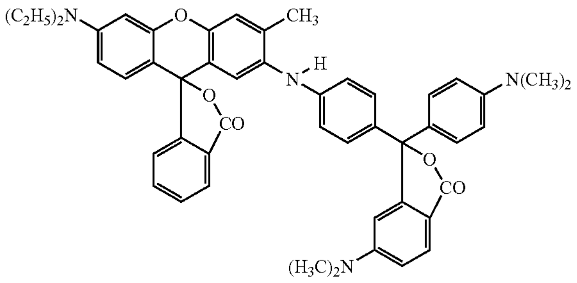

-continued

TB-6

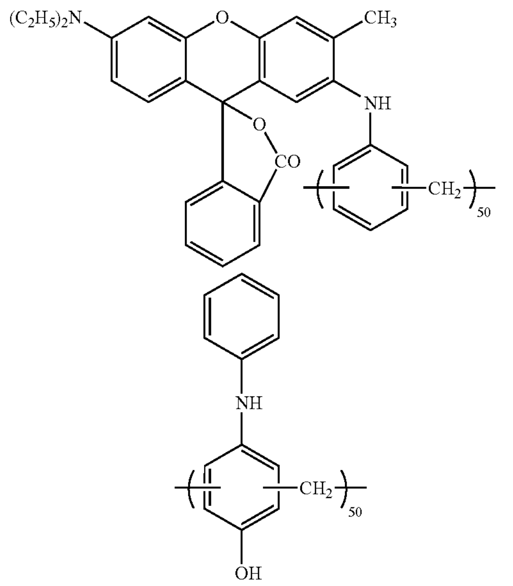

Mw = 1600

Each of the compositions above was added to by a concentration of 21 wt % solid content and stirred sufficiently, in 1-methoxypropane-2-ol, to give a photosensitive layer coating solution 1.

The photosensitive layer coating solution 1 was coated on the support in a coating amount of 2.5 $g/m^3$ after drying, and dried at 100° C. for 3 minutes, forming a photosensitive layer.

The photosensitive layer was then dried to give a planographic printing plate precursor of each of Examples 1 to 8.

Comparative Example 1

A planographic printing plate precursor of Comparative Example 1 was prepared in a similar manner to Example 1, except that the acid coloring colorant used for the photosensitive coating solution 1 was replaced with a dye, crystal violet, (having the following structure; Basic Violet 3, C.I. 42555, Gentiana Violet (trade name), manufactured by Aldrich Chemical Company).

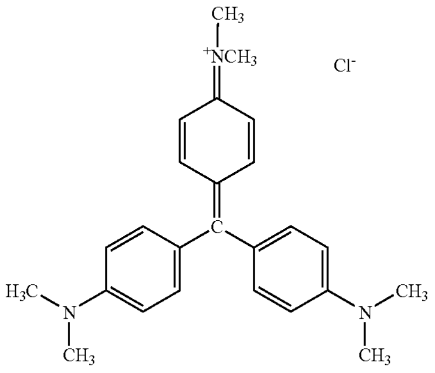

Dye: Crystal Violet

Comparative Example 2

A planographic printing plate precursor of Comparative Example 2 was prepared in a similar manner to Example 1, except that the specific polymer used for the photosensitive coating solution 1 was replaced with a cresol novolak resin (having the following structure; LB744 resin (trade name), manufactured by Bakelite).

LB744 resin

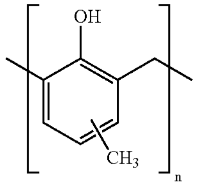

[Evaluation of Planographic Printing Plate Precursor]

(Evaluation of Chemical Resistance)

Each of the planographic printing plate precursors of Examples 1 to 8 and Comparative Examples 1 and 2 thus obtained was cut into a sample of 10 cm×10 cm in size. The sample was weighed and then immersed in an aqueous 25 wt % isopropyl alcohol solution for 24 hours. After 24 hours, the sample was collected and the surface was wiped with cotton wool. Photosensitive layer which had been solubilized by the solvent and thus weakened in adhesiveness was removed by this process. The sample was then weighed again after sufficient drying, and the difference between the weights before and after immersion was calculated. A sample with a smaller weight loss is regarded as superior in chemical resistance.

(Evaluation on Solubility in Alkaline Developer)

The planographic printing plate precursors prepared were immersed in a container containing a developer DT-1 manufactured by Fuji Photo Film (1:8 water dilution), respectively, for periods each increased at an increment of 2 seconds, washed with water, and thus the shortest period needed for complete solubilization of the photosensitive layer was determined.

Then, the entire surface was exposed to light in Trensetter manufactured by Creo at a beam intensity of 12 W and a drum rotational velocity of 250 rpm, and then, the period needed for solubilization of the photosensitive layer was determined, as described above. The ratio a/b of the required solubilization period before exposure ("a") to the required solubilization period after exposure ("b") was calculated and used as an indicator of the solubility evaluation. A higher ratio indicates a greater effect of solubilization-acceleration by exposure and a better solubilization discrimination of the planographic printing plate precursor.

These evaluation results are also summarized in Table 2 above.

As apparent from Table 2, all of the planographic printing plate precursors according to the invention are superior in each of chemical resistance, solubilization discrimination, and image reproducibility. In contrast, the planographic printing plate precursor of Comparative Example 1 that has the specific polymer according to the invention as the photosensitive layer but contains no acid coloring colorant is poorer in both chemical resistance and solubilization discrimination, and that of Comparative Example 2 containing an acid coloring colorant in the photosensitive layer but no specific polymer is inferior in chemical resistance.

What is claimed is:

1. A planographic printing plate precursor, comprising:

a support; and a photosensitive layer provided on the support and containing a polymer having the structural unit represented by the following Formula (1) and an acid coloring colorant represented by the following Formula (2), Formula (1)

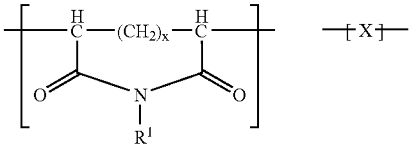

(A) (B)

Formula (2)

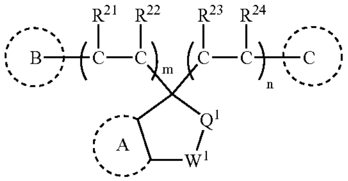

wherein, in Formula (1) above, X represents a bivalent connected group; $R^1$ represents an alkyl or aryl group; and x is 0 or 1, and in Formula (2) above, rings A, B, and C each independently represent a mono- to tri-nuclear aromatic hydrocarbon group or a heterocyclic aromatic group; at least one of the rings B and C is substituted with at least one substituent group selected from the group consisting of amino, alkoxy, aryloxy, alkylthio, and arylthio groups; rings B and C may bind to each other via a binding group; $W^1$ represents a carbonyl or thiocarbonyl group, or $—C(R^{25})═N—$, wherein $R^{25}$ represents a hydrogen atom or a hydrocarbon group, and $Q^1$ represents an oxygen or sulfur atom, or an imino group; $R^{21}$ to $R^{24}$ each independently represent a hydrogen atom or a hydrocarbon group; and m and n are each independently 0 or 1.

2. The planographic printing plate precursor according to claim 1, wherein X of the partial structure (B) in Formula (1) above is a group selected from the group consisting of alkylene group and binding groups represented by the following Formulae (1-2) and (1-3):

Formula (1-2)

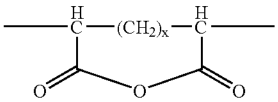

-continued

Formula (1-3)

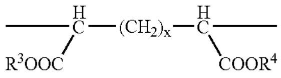

wherein, in Formula (1-2) or (1-3) above, x is 0 or 1; and in Formula (1-3), $R^3$ and $R^4$ each independently represent a hydrogen atom or an alkyl group.

3. The planographic printing plate precursor according to claim 2, wherein X of the partial structure (B) represents an alkylene group.

4. The planographic printing plate precursor according to claim 1, wherein $R^1$ in the partial structure (A) of Formula (1) above represents an alkyl group having 1 to 12 carbon atoms or a phenyl group.

5. The planographic printing plate precursor according to claim 1, wherein the content of the structural unit represented by Formula (1) in the polymer is 5 wt % or more.

6. The planographic printing plate precursor according to claim 1, wherein the polymer is substantially insoluble in one or more solvents selected from the group consisting of toluene, water, ethanol, chloroform, tetrahydrofuran and methylethylketone, at 25°C.

7. The planographic printing plate precursor according to claim 1, wherein the content of the polymer in the photosensitive layer is 20 to 90 wt % as solid matter concentration.

8. The planographic printing plate precursor according to claim 1, wherein ring A in the Formula above is a ring group selected from the group consisting of benzene, piperazine, thiophene, benzothiophene, furan, benzofuran, indole, and pyridine rings.

9. The planographic printing plate precursor according to claim 1, wherein rings B and C each independently represent a benzene or naphthalene ring.

10. The planographic printing plate precursor according to claim 1, wherein the binding group connecting the rings B and C is an atom or a group selected from the group consisting of oxygen and sulfur atoms and methylene and ethylene groups.

11. The planographic printing plate precursor according to claim 1, wherein when the rings B and C are bound to each other, m and n are both 0; and the rings B and C are bound to each other at the respective o-sites, to form a six-membered ring.

12. The planographic printing plate precursor according to claim 1, wherein each of the rings B and C is respectively substituted with at least one substituent group selected from the group consisting of amino, alkoxy, aryloxy, alkylthio, and arylthio groups.

13. The planographic printing plate precursor according to claim 12, wherein both the rings B and C contain at least one amino group.

* * * * *